US012588262B2

(12) United States Patent
Han et al.

(10) Patent No.: US 12,588,262 B2
(45) Date of Patent: Mar. 24, 2026

(54) SACRIFICIAL GATE CAPPING LAYER FOR GATE PROTECTION DURING SOURCE/DRAIN CONTACT OPENING

(71) Applicant: Tokyo Electron Limited, Tokyo (JP)

(72) Inventors: Yun Han, Albany, NY (US); Eric Chih-Fang Liu, Albany, NY (US); Kai-Hung Yu, Albany, NY (US); Shihsheng Chang, Albany, NY (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 692 days.

(21) Appl. No.: 17/721,551

(22) Filed: Apr. 15, 2022

(65) Prior Publication Data

US 2022/0359718 A1      Nov. 10, 2022

Related U.S. Application Data

(60) Provisional application No. 63/186,665, filed on May 10, 2021.

(51) Int. Cl.
*H10D 64/01*        (2025.01)
*H01L 21/311*        (2006.01)
*H10D 30/01*        (2025.01)

(52) U.S. Cl.
CPC ...... *H10D 64/017* (2025.01); *H01L 21/31116* (2013.01); *H01L 21/31144* (2013.01); *H10D 64/01* (2025.01); *H10D 30/024* (2025.01)

(58) Field of Classification Search
None
See application file for complete search history.

(56) References Cited

U.S. PATENT DOCUMENTS

| | | | |
|---|---|---|---|
| 10,249,755 B1 | 4/2019 | Cheng et al. |
| 10,283,406 B2 | 5/2019 | Basker et al. |
| 10,325,911 B2 | 6/2019 | Lu et al. |
| 10,418,280 B2 | 9/2019 | Basker et al. |

(Continued)

OTHER PUBLICATIONS

International Search Report and Written Opinion issued Aug. 26, 2022 in PCT/US2022/028050, 8 pages.

(Continued)

*Primary Examiner* — Sue A Purvis
*Assistant Examiner* — Seyon Ali-Simah Punchbeddell
(74) *Attorney, Agent, or Firm* — Oblon, McClelland, Maier & Neustadt, L.L.P.

(57)        ABSTRACT

A method including providing a substrate including metal gate stacks and source/drain contact regions in alternating arrangement along a surface of the substrate, each of the source/drain contact regions being recessed within a respective opening between adjacent metal gate stacks such that source/drain contact regions provide a bottom of the opening and adjacent metal gate stacks provide sidewalls, and a dielectric covering the substrate such that the dielectric fills each opening. The substrate is exposed to an initial plasma etch process to remove a first portion of the dielectric from each opening down to a first depth, and a sacrificial gate capping layer is formed on the substrate while leaving each of the openings uncovered. The substrate is exposed to another plasma etch process to remove the sacrificial gate capping layer while removing a second portion of the dielectric from each opening down to a second depth.

19 Claims, 5 Drawing Sheets

(56)  References Cited

U.S. PATENT DOCUMENTS

| | | | |
|---|---|---|---|
| 10,510,885 B1 | 12/2019 | Cheng et al. | |
| 10,707,128 B2 | 7/2020 | Basker et al. | |
| 10,840,243 B2 | 11/2020 | Lu et al. | |
| 10,847,630 B2 | 11/2020 | Bae et al. | |
| 10,998,230 B2 | 5/2021 | Basker et al. | |
| 11,121,032 B2 | 9/2021 | Basker et al. | |
| 2015/0171091 A1* | 6/2015 | Lytle | H01L 21/823828 |
| | | | 257/369 |
| 2018/0083002 A1 | 3/2018 | Kim et al. | |
| 2018/0151678 A1 | 5/2018 | Li | |
| 2018/0190653 A1 | 7/2018 | Lu et al. | |
| 2018/0211874 A1 | 7/2018 | Basker et al. | |
| 2018/0211875 A1 | 7/2018 | Basker et al. | |
| 2019/0096884 A1 | 3/2019 | Lu et al. | |
| 2019/0198393 A1 | 6/2019 | Basker et al. | |
| 2019/0198394 A1 | 6/2019 | Basker et al. | |
| 2019/0341309 A1 | 11/2019 | Basker et al. | |
| 2019/0393344 A1 | 12/2019 | Cheng et al. | |
| 2019/0393345 A1 | 12/2019 | Cheng et al. | |
| 2020/0058748 A1 | 2/2020 | Bae et al. | |
| 2020/0411665 A1 | 12/2020 | Hafez et al. | |
| 2021/0091078 A1 | 3/2021 | Lu et al. | |
| 2021/0111071 A1* | 4/2021 | Yang | H01L 29/41791 |

OTHER PUBLICATIONS

Taiwanese Office Action dated Jul. 24, 2025 in Taiwanese Patent Application No. 111117280 w/English translation, 15 pages.
Japanese Office Action issued Aug. 19, 2025 in Japanese Patent Application No. 2023-565461 with English translation, 6 pgs.

* cited by examiner

SACRIFICIAL GATE CAPPING LAYER FOR GATE PROTECTION DURING SOURCE/DRAIN CONTACT OPENING

CROSS-REFERENCE TO RELATED APPLICATIONS

The present disclosure claims the benefit of U.S. Provisional Application No. 63/186,665 filed May 10, 2021, which is incorporated herein by reference in its entirety.

TECHNICAL FIELD

The present invention relates generally to semiconductor device fabrication, and more particularly, to methods for forming a sacrificial gate capping layer for gate protection during plasma etching.

BACKGROUND

Advancement in semiconductor technologies relies on continued improvement in manufacturing fabrication technology. Innovation in semiconductor technologies has resulted in the introduction of new types of structures such as FinFET devices, stacked structures (e.g., 3D NAND devices). However, these new structures introduce a need for new fabrication schemes to overcome, what would otherwise be, debilitating manufacturing challenges. One such challenge arises from damage to cap layers as well as erosion of spacers on gate sidewalls as a result of semiconductor plasma processing techniques. For instance, a dry etch process such as reactive Ion etching (RIE) may be used to open contacts within traditional middle-of-line (MOL) process flow. Often, the dry etch process can be quite aggressive for some layers within a semiconductor process flow. Typically, the dry etch process possesses a plasma source that generates a sea of ions that accelerate in a manner that causes ion bombardment against sensitive device layers. Resultantly, the plasma etch processes may cause damage to the underlying material, especially when opening high aspect ratio contact holes. This damage to the underlying material can then lead to uncontrolled variations in device electrical performance, as well as yield loss.

SUMMARY

The present disclosure relates to a semiconductor device, and a method of manufacturing a semiconductor device.

Aspect (1) provides a method including providing a substrate including a plurality of metal gate stacks and a plurality of source/drain contact regions in alternating arrangement along a surface of the substrate, wherein each of the source/drain contact regions is recessed within a respective opening between adjacent metal gate stacks such that the source/drain contact regions provides a bottom of the opening and the adjacent metal gate stacks provide sidewalls of the opening, and a dielectric covering the substrate such that the dielectric fills each opening. The substrate is exposed to an initial plasma etch process to remove a first portion of the dielectric from each opening down to a first depth in the opening, and a sacrificial gate capping layer is formed on the substrate while leaving each of the openings uncovered by the sacrificial gate capping layer. The substrate is exposed to another plasma etch process to remove the sacrificial gate capping layer while removing a second portion of the dielectric from each opening down to a second depth in the opening.

Aspect (2) includes the method of aspect (1), wherein the exposing the substrate to another plasma etch process includes removing all of the dielectric from each of the openings to expose each of the source/drain contact regions.

Aspect (3) includes the method of aspect (1), wherein the exposing the substrate to another plasma etch process includes removing the second portion to a second depth which does not remove all of the dielectric from each of the openings and does not expose each of the source/drain contact regions.

Aspect (4) includes the method of aspect (3), wherein the exposing the substrate to another plasma etch process includes stopping the another plasma etch process before completely removing the sacrificial gate capping layer.

Aspect (5) includes the method of aspect (4), further including repeating the forming a sacrificial gate capping layer and the exposing the substrate to another plasma etch process until all of the dielectric is removed from each of the openings to expose the source/drain contact regions.

Aspect (6) includes the method of aspect (1), wherein the substrate further includes a conformal spacer layer within each respective opening, the conformal spacer layer covering a bottom and sidewalls of the respective opening, the dielectric covering the conformal spacer layer to fill each respective opening.

Aspect (7) includes the method of aspect (6), wherein the initial plasma etch process exposes a portion of the conformal spacer layer on sidewalls within each respective opening.

Aspect (8) includes the method of aspect (7), wherein the forming a sacrificial gate capping layer includes covering the portion of the conformal spacer layer on sidewalls within each respective opening.

Aspect (9) includes the method of aspect (8), wherein the forming a sacrificial gate capping layer includes forming the sacrificial gate capping layer having a first thickness on top of each metal gate stack and a second thickness on the sidewalls, the first thickness being greater than the second thickness.

Aspect (10) includes the method of aspect (9), wherein the forming a sacrificial gate capping layer includes forming the sacrificial gate capping layer on each sidewall such that a thickness of the sacrificial gate capping layer decreases from the upper portion of the opening toward the bottom of the opening.

Aspect (11) includes the method of aspect (8), wherein the exposing the substrate to another plasma etch process includes removing all of the dielectric from each of the openings to expose the conformal spacer layer covering a bottom each respective opening.

Aspect (12) includes the method of aspect (11), further including repeating the forming a sacrificial gate capping layer and the exposing the substrate to another plasma etch process to remove the conformal spacer layer covering a bottom of each respective opening such that each of the source/drain contact regions is exposed.

Aspect (13) includes the method of aspect (1), further including forming a hard mask over the substrate, the hard mask including an exposure window over the openings.

Aspect (14) includes the method of aspect (13), wherein the forming a sacrificial gate capping layer includes covering at least a portion of the hard mask with the sacrificial gate capping layer.

Another aspect (15) provides a method including providing a substrate including a source/drain contact region covered by an interlayer dielectric (ILD), a replacement metal gate adjacent the source/drain contact region, and a spacer on a sidewall of the replacement metal gate and on the source/drain contact region. A first portion of the ILD above the source/drain contact region is removed using a first plasma etching process. A sacrificial gate capping layer is formed on the replacement metal gate and on the spacer, the sacrificial gate capping layer having a first thickness on an upper portion of the spacer and a smaller second thickness on a lower portion of the spacer that is not covered by the ILD. A second portion of the ILD is removed using a second plasma etching process.

Aspect (16) includes the method of aspect (15), further including fully removing the ILD above the source drain contact region by repeating at least once the forming the sacrificial gate capping layer and removing the second portion of the ILD.

Aspect (17) includes the method of aspect (16), further including following fully removing the ILD, depositing an additional sacrificial gate capping layer on the replacement metal gate and on the spacer. The spacer above the source/drain contact region is removed using a third plasma etching process.

Aspect (18) includes the method of aspect (15), wherein the sacrificial gate capping layer includes an oxide.

Aspect (19) includes the method of aspect (15), wherein the substrate further includes a patterned hard mask.

Aspect (20) includes the method of aspect (19), wherein the forming a sacrificial gate capping layer includes covering at least a portion of the hard mask with the sacrificial gate capping layer.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION OF ILLUSTRATIVE EMBODIMENTS

Figure 1A:
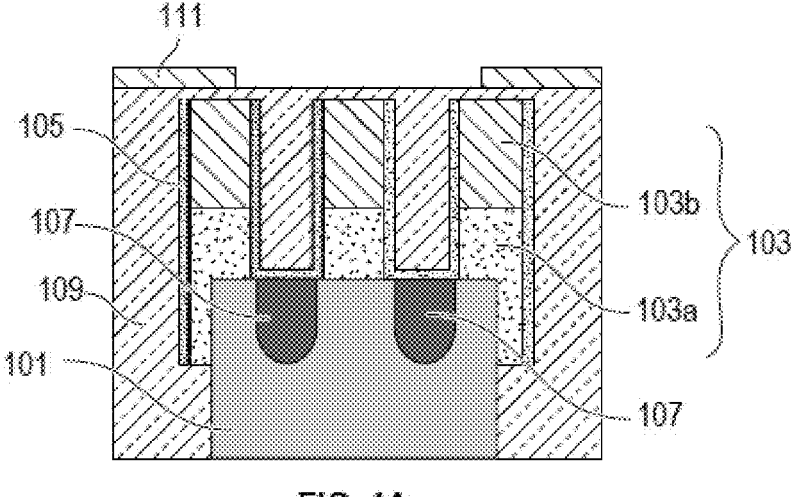
FIGS. 1A, 1B, 1C, 1D, 1E, 1F, and 1G are schematic illustrations of a substrate at various semiconductor processing steps of a method in accordance with an example embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The method and using of various embodiments of a semiconductor device are discussed in detail below. However, it should be valued that the various embodiments detailed herein may be applicable in a wide variety of disciplines. The specific embodiments described herein are merely illustrative of specific ways to make and use various embodiments, and should not be construed in a limited scope. Embodiments of the application may be applied to various types of devices such as FinFET transistors as well as stacked memory devices. Specific embodiments of the above process will be described using the figures below.

Figure 2A:
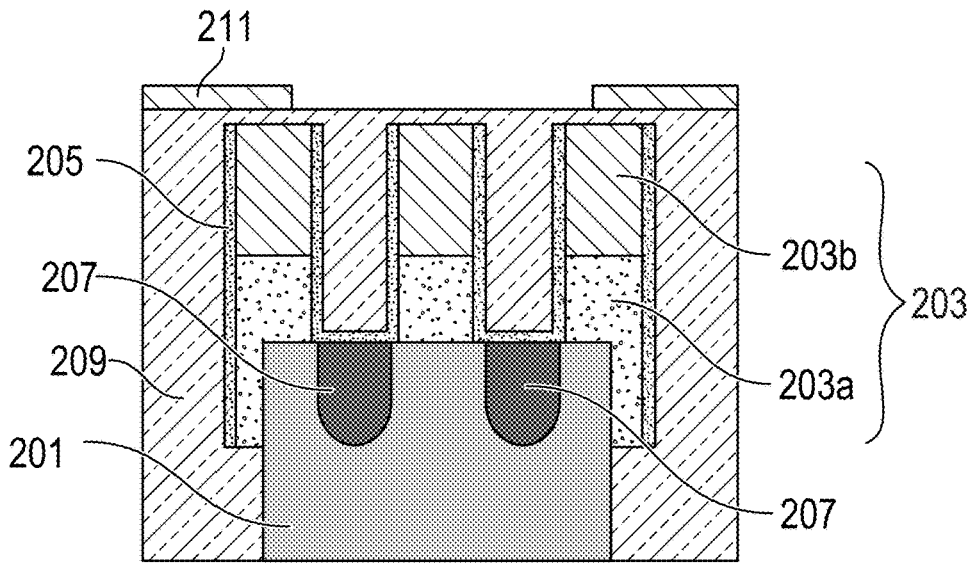
FIGS. 2A and 2B are schematic illustrations of a problem with conventional semiconductor processing methods.
Figure 2B:
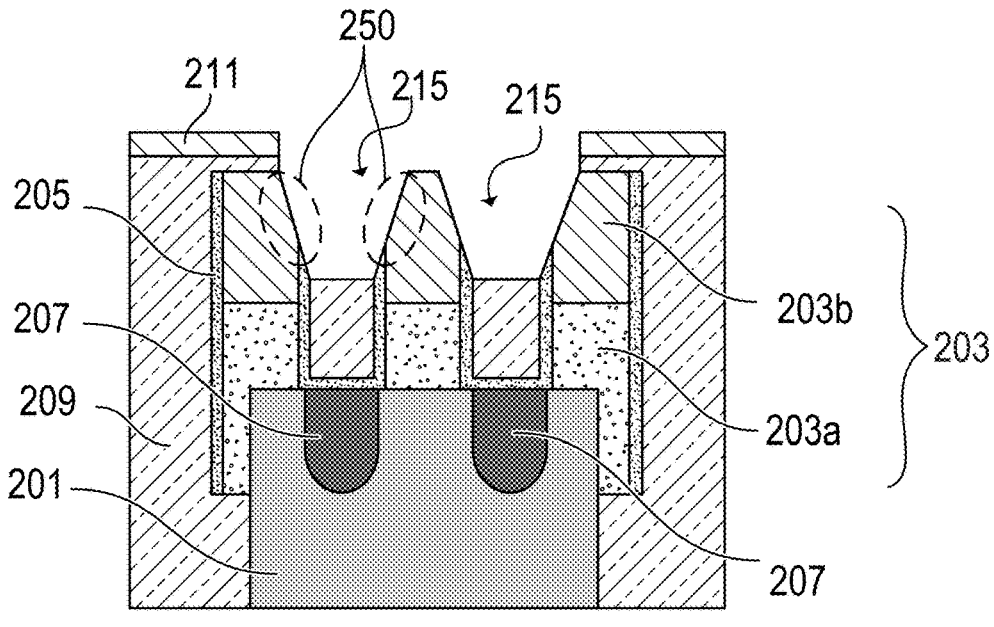

Embodiments of the present application disclose a method for preventing or reducing damage to semiconductor regions during plasma etching. In one embodiment, the proposed integration scheme addresses gate corner loss during a contact open etch process for manufacturing advanced FinFET devices. FIGS. 2A and 2B illustrate this problem in semiconductor processing. FIG. 2A illustrates a partial cross sectional view of a semiconductor device during fabrication. The semiconductor device has already gone through a substantial part of the front-end-of-the-line (FEOL) fabrication.

In various embodiments, the substrate 201 in FIG. 2A may comprise silicon, silicon germanium, silicon carbide, and compound semiconductors such as gallium nitride, gallium arsenide, indium arsenide, indium phosphide, and others. The substrate may comprise a semiconductor wafer that may include a semiconductor epitaxial layer including hetero epitaxial layers. For example, in one or more embodiments, one or more hetero epitaxial layers comprising a compound semiconductor may be formed over a semiconductor substrate. In various embodiments, a portion or an entirety of the substrate may be amorphous, polycrystalline, or single-crystalline. In various embodiments, the substrate may be doped, undoped, or contain both doped and undoped regions.

A plurality of fins (not shown) may be formed by epitaxial growth from the substrate or alternatively using an etch back process leaving the plurality of fins. The plurality of fins may be isolated from each other by shallow isolation regions (not shown). Accordingly, the shallow isolation regions and the plurality of fins may form an alternating pattern.

The semiconductor device in FIG. 2A further includes a replacement metal gate (RMG) 203 containing a replacement gate metal 203a ("gate") and a gate cap 203b (e.g., SiN) on the replacement gate metal. The RMG helps to set the work function of the gate and forms the final gate electrode of the semiconductor device.

A plurality of spacers 205 (e.g., SiN) are formed on sidewalls of the RMGs 203. In some examples, the spacer 205 can include SiN or a low-k material. The plurality of spacers 205 may be formed by depositing an insulating layer followed by an anisotropic etching process. For example, a reactive ion etch (ME) process may be used to form the spacers. In some embodiments, the plurality of spacers can comprise silicon nitride, silicon oxide, or silicon oxynitride. In various embodiments, the spacers 205 may have a thickness ranging from 0.5 nm to about 10 nm. In one embodiment, the spacers 205 may have a thickness ranging from 2 nm to about 5 nm.

Epitaxial regions 207 ("epi") are grown over portions of the plurality of fins located between the plurality of RMGs 203 so as to form raised source/drain contact regions. The upper surface of the raised source/drain regions may form a faceted surface due to the growth pattern of the corresponding epitaxial material. Examples of materials used in the epitaxial region 207 can include Si and SiGe. The epitaxial growth process may use any type of epitaxial process including molecular beam epitaxy (MBE), or various types of chemical vapor deposition (CVD).

The semiconductor device further includes an interlayer dielectric 209 (ILD) that fills the recessed features between the plurality of RMGs 203. In various embodiments of semiconductor devices, the ILD 209 may include an oxide. In one example, an ILD comprising borophosphosilicate glass (BPSG), phosphosilicate glass (PSG), borosilicate glass (BSG), arsenic-silicon glass (AsSG), or other types of glass may be deposited and heated to reflow. In one or more embodiments, the ILD 209 may also comprise an oxide such as tetra ethyl oxysilane (TEOS), fluorinated TEOS (FTEOS), organo silicate glass (OSG), fluorinated silicate glass (FSG), or a spin-on glass (SOG).

The semiconductor device further contains a patterned hard mask 211 (HM) that defines an opening below the HM 211.

FIG. 2B shows gate corner loss 250 during a conventional contact open etch. The contact open etch includes an anisotropic plasma etch process that is defined by the overlying patterned HM 211. The contact open etch process removes the ILD 109 from the recessed features 215 above the epitaxial regions, and further removes the spacer 205 above the epitaxial regions. As schematically shown in FIG. 2B, the contact open etch can result in a corner loss 250 where a portion of the spacer 205 and the gate cap are damaged and partially etched away as the ILD 209 is removed. In one example, the corner loss 250 is at least in part due to low etch selectivity between the ILD 209 (e.g., oxide) and the spacer 205 (e.g., SiN). This type of corner loss can result in electrical shorting and eventual failure of the semiconductor device. Embodiments of the invention address this problem of corner loss during a contact open etch.

FIGS. 1A-1E schematically show processing of a substrate according to an embodiment of the invention. The semiconductor device in FIG. 1A has been reproduced in FIG. 2A.

Figure 1B:
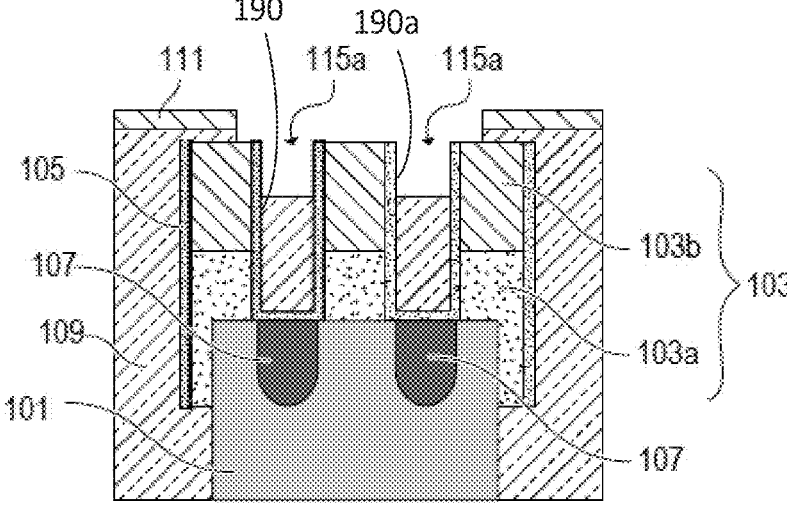

FIG. 1B shows the semiconductor device following a first plasma etch process, defined by the opening in the patterned HM 111, that recesses the ILD 109 by removing a portion of the ILD 109 to form partial openings 115a in the ILD 109, the partial openings 115a uncovering a portion 190a of sidewalls 190 provided by adjacent metal gate stacks, which may include a replacement gate metal 103a, a gate cap 103b and a spacer 105. The first plasma etch process is characterized by low ion energy ($E_i$) and high etch selectivity between the ILD 109 and the spacer 105 and the gate cap 103b. The spacer 105 and the gate cap 1036 at least substantially retain their shapes during the first plasma etch process. In one example, the first plasma etch process can include alternating exposures of a plasma-excited etch gas containing $C_4F_6$ and $O_2$, and plasma-excited argon (Ar) gas. The high etch selectivity may be achieved by applying low bias power to the substrate 101 and maintaining the substrate 101 at a relatively high temperature (e.g., between about 100° C. and about 150° C.).

Figure 1C:
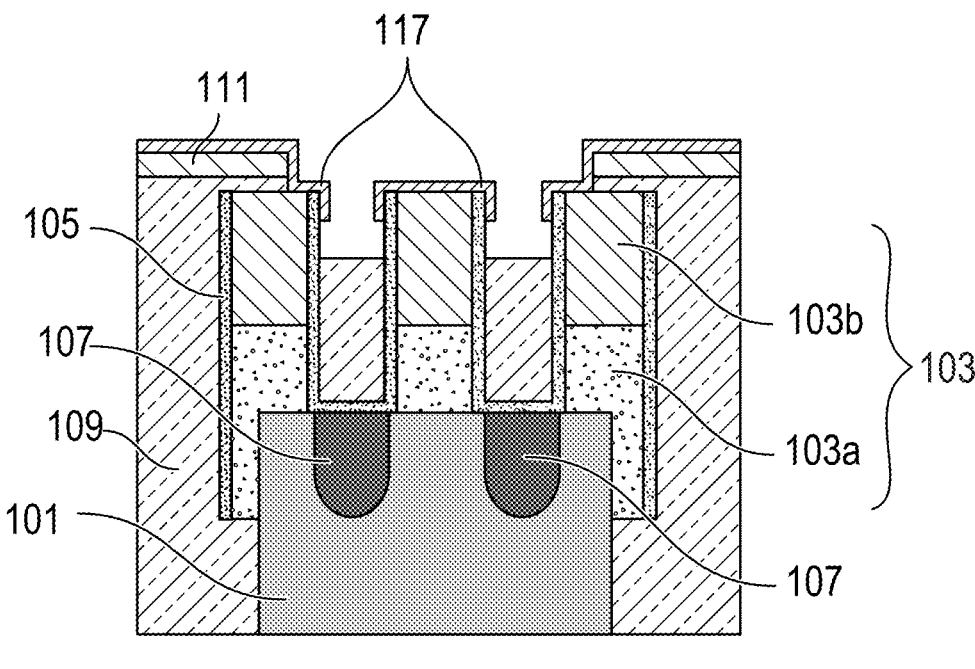

FIG. 1C shows the semiconductor device during a next stage of fabrication, after depositing a sacrificial gate capping layer 117 in accordance with an embodiment of the present invention. The sacrificial gate capping layer 117 may be preferentially deposited on an upper portion of the semiconductor device, including on the patterned HM 111, on the gate cap 103b, and on an upper portion of the spacer 105 on the sidewall above the partially recessed ILD 109. According to one embodiment, a thickness of the sacrificial gate capping layer 117 can decrease from the upper portion of the semiconductor device towards the remaining ILD 109. In one embodiment, the sacrificial gate capping layer is formed using a vapor phase deposition process, for example an atomic layer deposition (ALD) process, or a chemical vapor deposition process (CVD) and other such processes. According to one embodiment, the sacrificial gate capping layer may include an oxide, for example $SiO_2$, that is deposited in a cyclical deposition process using alternating exposures of a silicon-containing precursor and $O_2$ gas. For example, a $SiO_2$ thickness of the sacrificial gate capping layer 117 on top of the semiconductor device relative to on a sidewall of the spacer 105 may be selected using processing parameters such as $O_2$ gas exposure times and gas pressure. These processing parameters affect how much $O_2$ gas diffuses into the recessed features and reacts with the silicon-containing precursor. In various embodiments, the sacrificial gate capping layer may have a thickness ranging from 0.5 nm to about 10 nm on the top of the gate cap. In one embodiment, the sacrificial gate capping layer may have a thickness ranging from 2 nm to about 5 nm.

Figure 1D:
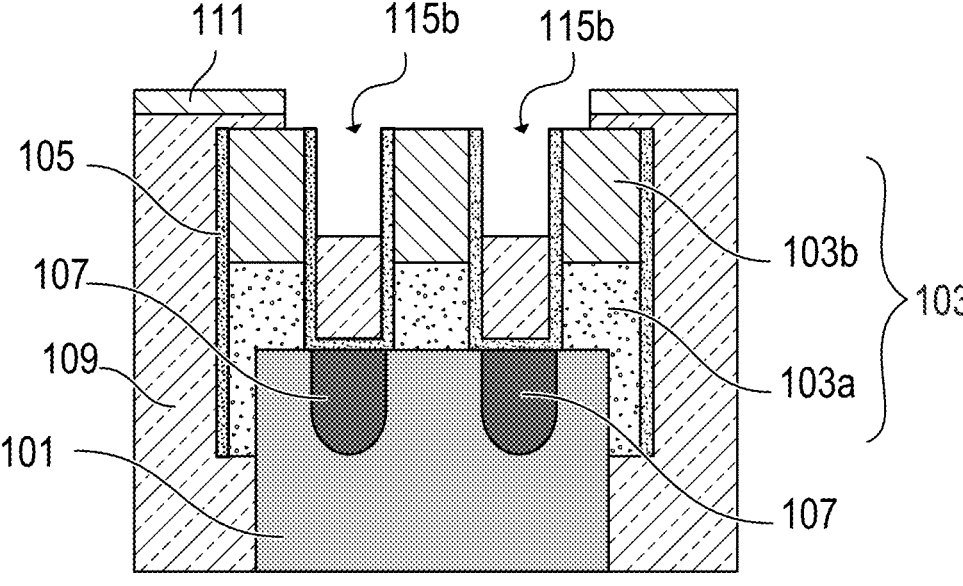

FIG. 1D shows the semiconductor device following a second plasma etch process defined by the opening in the HM 111 that removes a further portion of the ILD 109 to form deeper openings 115b. The second plasma etch process further removes the ILD 109 in the recessed feature above the epitaxial regions, but the sacrificial gate capping layer 117 at least substantially prevents the type of corner loss 250 depicted in FIG. 2B where a portion of the spacer 205 and the gate cap 203b are etched when the ILD 209 is removed. In one example, the second plasma etch process can include alternating exposures of a plasma-excited etch gas containing $C_4F_6$ and $O_2$, and plasma-excited argon (Ar) gas. Unlike the first plasma etch process, the second plasma etch process may apply high bias power to the substrate to achieve fast directional etch of the ILD 109. In one example, the second plasma etch process may be terminated when the sacrificial gate capping layer 117 is at least substantially removed.

Figure 1E:
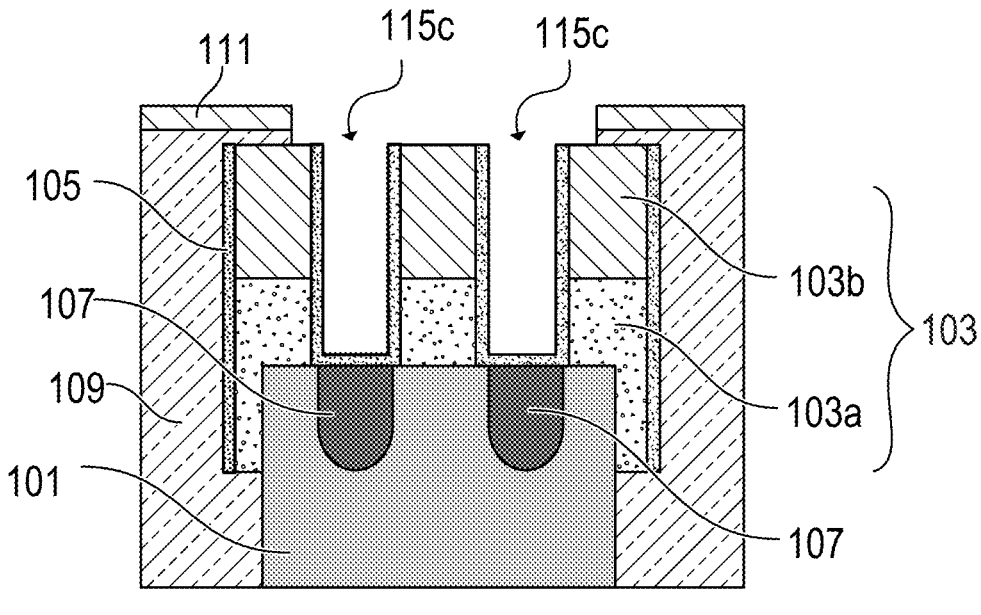

Thereafter, the steps of depositing a sacrificial gate capping layer 117 and the second dry etch process may be repeated at least once until the ILD 109 is fully removed from the recessed features 115b and from the spacer layer 105 at the bottom of the recessed feature 115c above the epitaxial region 107. The resulting semiconductor device is shown in FIG. 1E.

Figure 1F:
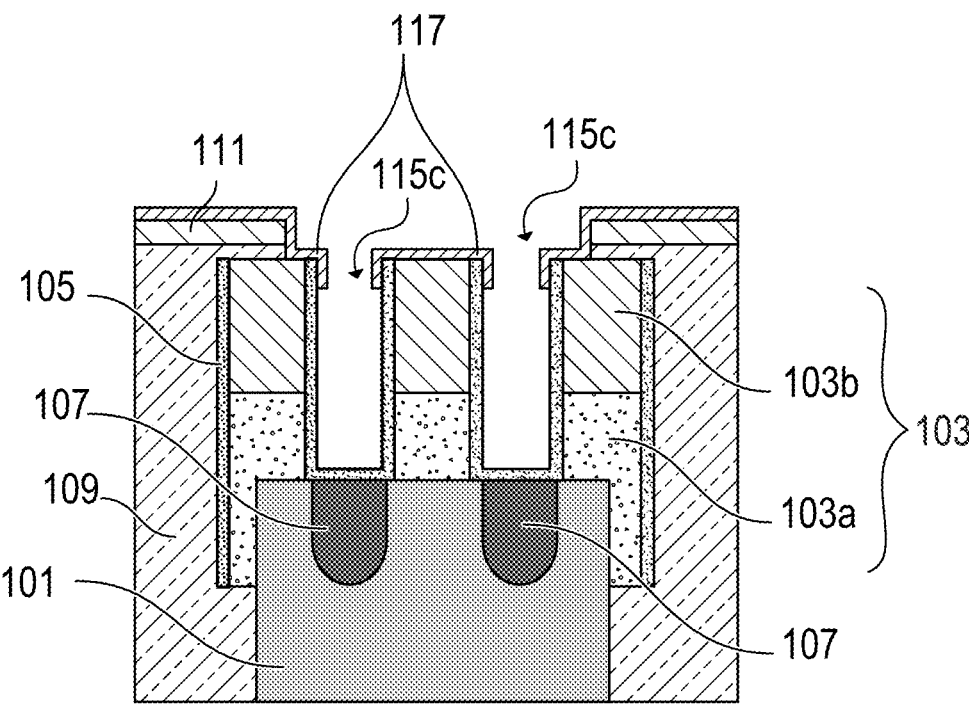
Figure 1G:
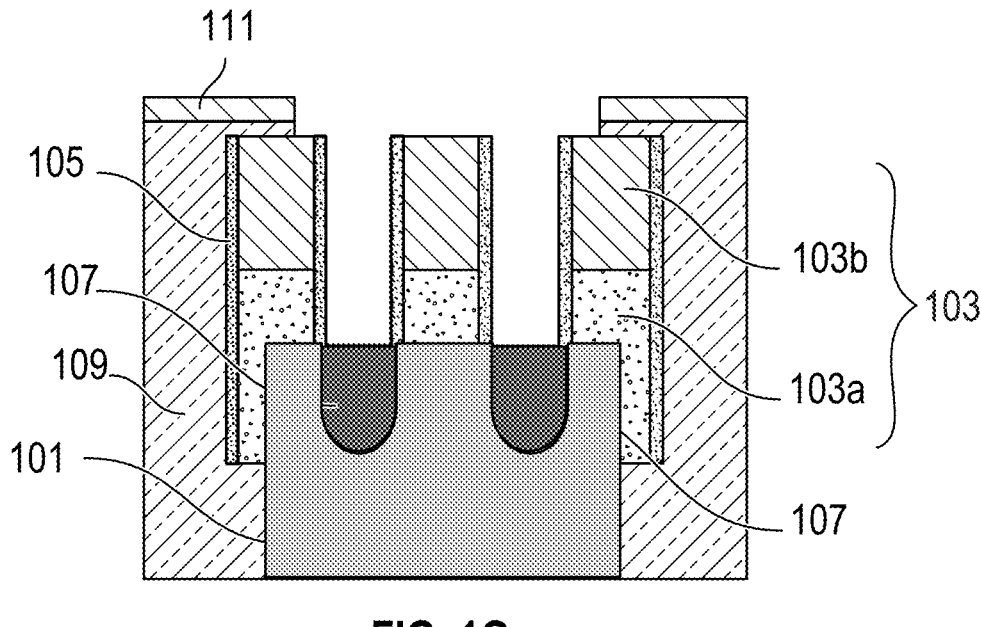

Following the removal of the ILD 109, the semiconductor device may be further processed as shown in FIG. 1F. The step of depositing the sacrificial gate capping layer 117 as described above may be repeated, and thereafter, a third plasma etch process may be performed to etch through the horizontal portion of the spacer 105 above the epitaxial region 107 at the bottom of the recessed feature as shown in FIG. 1G. The third plasma etch process can, for example, include a continuous etch that includes a plasma-excited etch gas containing $C_4F_6$, $O_2$, and Ar. High etch selectivity may be achieved by applying low bias power to the substrate. This also avoids damaging the epitaxial region 107 when etching through the horizontal portion of the spacer 105 above the epitaxial region 107.

According to one embodiment, the steps of first plasma etching, depositing a sacrificial gate capping layer 117, second plasma etching, and third plasma etching may be performed in a single process chamber. The process chamber can include a bias electrode (substrate holder), an optional top electrode above the substrate, a gas inlet system, a pumping system, and a substrate heating system.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method comprising:

providing a substrate comprising a plurality of metal gate stacks and a plurality of source/drain contact regions in alternating arrangement along a surface of a base substrate structure, wherein each of the source/drain contact regions is recessed within a respective opening between adjacent metal gate stacks such that the source/drain contact region provides a bottom of the opening and the adjacent metal gate stacks provide sidewalls of the opening, and a dielectric covering the substrate such that the dielectric fills each opening;

exposing the substrate to an initial plasma etch process to remove a first portion of the dielectric from each opening down to a first depth in the opening which uncovers a portion of the sidewalls provided by the adjacent metal gate stacks;

forming a sacrificial gate capping layer on the substrate while leaving each of the openings uncovered by the sacrificial gate capping layer; and exposing the substrate to another plasma etch process to remove the sacrificial gate capping layer while removing a second portion of the dielectric from each opening down to a second depth in the opening.

2. The method of claim 1, wherein the exposing the substrate to another plasma etch process comprises removing all of the dielectric from each of the openings to expose each of the source/drain contact regions.

3. The method of claim 1, wherein the exposing the substrate to another plasma etch process comprises removing the second portion to a second depth which does not remove all of the dielectric from each of the openings and does not expose each of the source/drain contact regions.

4. The method of claim 3, wherein the exposing the substrate to another plasma etch process comprises stopping the another plasma etch process before completely removing the sacrificial gate capping layer.

5. The method of claim 4, further comprising repeating the forming a sacrificial gate capping layer and the exposing the substrate to another plasma etch process until all of the dielectric is removed from each of the openings to expose the source/drain contact regions.

6. The method of claim 1, wherein the metal gate stacks include a conformal spacer layer formed as the sidewalls provided by the adjacent metal gate stacks.

7. The method of claim 6, wherein the initial plasma etch process exposes a portion of the conformal spacer layer that corresponds to the portion of the sidewalls.

8. The method of claim 7, wherein the forming a sacrificial gate capping layer comprises covering the exposed portion of the conformal spacer layer.

9. The method of claim 8, wherein the forming a sacrificial gate capping layer comprises forming the sacrificial gate capping layer having a first thickness on top of each metal gate stack and a second thickness on the sidewalls of the metal gate stacks, the first thickness being greater than the second thickness.

10. The method of claim 9, wherein the forming a sacrificial gate capping layer comprises forming the sacrificial gate capping layer on each sidewall of the metal gate stacks such that a thickness of the sacrificial gate capping layer decreases from the upper portion of the opening toward the bottom of the opening.

11. The method of claim 8, wherein the exposing the substrate to another plasma etch process comprises removing all of the dielectric from each of the openings to expose the conformal spacer layer covering a bottom each respective opening.

12. The method of claim 11, wherein the conformal spacer layer is further formed on a bottom of each respective opening, and the method further comprises repeating the forming a sacrificial gate capping layer and the exposing the substrate to another plasma etch process to remove the conformal spacer layer covering the bottom of each respective opening such that each of the source/drain contact regions is exposed.

13. The method of claim 1, further comprising forming a hard mask over the substrate, the hard mask comprising an exposure window over the openings.

14. The method of claim 13, wherein the forming a sacrificial gate capping layer comprises covering at least a portion of the hard mask with the sacrificial gate capping layer.

15. A method comprising:

providing a substrate comprising a source/drain contact region, a replacement metal gate adjacent the source/drain contact region to provide a sidewall of a recess with the source/drain contact region at a bottom of the recess, a spacer formed on the sidewall of the replacement metal gate and on the source/drain contact region, and an interlayer dielectric (ILD) provided above the source/drain contact region to at least partially fill the recess;

removing a first portion of the ILD above the source/drain contact region using a first plasma etching process to uncover a portion of the spacer formed on the sidewall of the replacement metal gate;

forming a sacrificial gate capping layer on the replacement metal gate and on the spacer formed on the sidewall within the recess, the sacrificial gate capping layer having a first thickness on an upper portion of the spacer formed on the sidewall and a smaller second thickness on a lower portion of the spacer formed on the sidewall that is not covered by the ILD;

removing a second portion of the ILD using a second plasma etching process to uncover an additional portion of the spacer formed on the sidewall of the replacement metal gate; and fully removing the ILD above the source drain contact region by repeating at least once the forming the sacrificial gate capping layer and removing the second portion of the ILD.

16. The method of claim 15, further comprising:

following fully removing the ILD, depositing an additional sacrificial gate capping layer on the replacement metal gate and on the spacer formed on the sidewall of the replacement metal gate; and removing the spacer above the source/drain contact region using a third plasma etching process.

17. The method of claim 15, wherein the sacrificial gate capping layer includes an oxide.

18. The method of claim 15, wherein the substrate further includes a patterned hard mask.

19. The method of claim 18, wherein the forming a sacrificial gate capping layer comprises covering at least a portion of the hard mask with the sacrificial gate capping layer.

* * * * *